United States Patent
Bhattacharyya

(10) Patent No.: US 10,892,340 B2
(45) Date of Patent: Jan. 12, 2021

(54) MEMORY CELL STRUCTURES

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/293,159

(22) Filed: Mar. 5, 2019

(65) Prior Publication Data

US 2019/0198631 A1 Jun. 27, 2019

Related U.S. Application Data

(62) Division of application No. 15/641,475, filed on Jul. 5, 2017, now abandoned.

(51) Int. Cl.
| | |
|---|---|
| *H01L 29/423* | (2006.01) |
| *H01L 27/11521* | (2017.01) |
| *H01L 27/11568* | (2017.01) |
| *H01L 21/28* | (2006.01) |

(52) U.S. Cl.
CPC .. *H01L 29/42324* (2013.01); *H01L 27/11521* (2013.01); *H01L 27/11568* (2013.01); *H01L 29/40117* (2019.08); *H01L 29/4234* (2013.01)

(58) Field of Classification Search
CPC ......... H01L 29/42324; H01L 29/40117; H01L 27/11568; H01L 27/11521; H01L 29/4234
See application file for complete search history.

(56) References Cited

U.S. PATENT DOCUMENTS

| | | | |
|---|---|---|---|
| 4,870,470 A | | 9/1989 | Bass et al. |
| 5,590,075 A | * | 12/1996 | Mazzali ................. G11C 29/10 365/185.09 |
| 6,709,928 B1 | | 3/2004 | Jenne |
| 6,743,681 B2 | | 6/2004 | Bhattacharyya |
| 6,743,682 B2 | | 6/2004 | Woerlee et al. |
| 6,888,200 B2 | | 5/2005 | Bhattacharyya |
| 6,903,969 B2 | | 6/2005 | Bhattacharyya |
| 6,917,078 B2 | | 7/2005 | Bhattacharyya |
| 6,998,667 B2 | | 2/2006 | Bhattacharyya |
| 7,012,297 B2 | | 3/2006 | Bhattacharyya |
| 7,042,027 B2 | | 5/2006 | Bhattacharyya |
| 7,130,216 B2 | | 10/2006 | Bhattacharyya |
| 7,145,186 B2 | | 12/2006 | Bhattacharyya |
| 7,158,410 B2 | | 1/2007 | Bhattacharyya et al. |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Marcos D. Pizarro
*Assistant Examiner* — Sue Tang
(74) *Attorney, Agent, or Firm* — Brooks, Cameron & Huebsch, PLLC

(57) ABSTRACT

In an example, a memory cell may have an interface dielectric adjacent to a semiconductor, a tunnel dielectric adjacent to the interface dielectric, a charge trap adjacent to the tunnel dielectric, a blocking dielectric adjacent to the charge trap, and a control gate adjacent to the blocking dielectric.

20 Claims, 4 Drawing Sheets

(56) References Cited

U.S. PATENT DOCUMENTS

| | | | |
|---|---|---|---|
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2 | 12/2009 | Bhattacharyya | |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2 | 2/2012 | Bhattacharyya | |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 2001/0030340 A1 | 10/2001 | Fujiwara | |
| 2004/0251489 A1 | 12/2004 | Jeon et al. | |
| 2006/0180851 A1* | 8/2006 | Lee | H01L 27/11529 257/315 |
| 2006/0258090 A1 | 11/2006 | Bhattacharyya et al. | |
| 2006/0261401 A1 | 11/2006 | Bhattacharyya | |
| 2007/0034922 A1 | 2/2007 | Bhattacharyya | |
| 2007/0272916 A1 | 11/2007 | Wang et al. | |
| 2008/0073704 A1* | 3/2008 | Yasuda | H01L 29/40117 257/324 |
| 2008/0124908 A1 | 5/2008 | Forbes et al. | |
| 2008/0179762 A1 | 7/2008 | Cho et al. | |
| 2008/0246078 A1* | 10/2008 | Huo | B82Y 10/00 257/324 |
| 2008/0303080 A1 | 12/2008 | Bhattacharyya | |
| 2009/0294924 A1* | 12/2009 | Forbes | C23C 16/308 257/635 |
| 2010/0072535 A1 | 3/2010 | Takashima et al. | |
| 2010/0090265 A1 | 4/2010 | Bhattacharyya et al. | |
| 2010/0123181 A1* | 5/2010 | Park | H01L 27/11568 257/324 |
| 2015/0371998 A1* | 12/2015 | Lue | H01L 29/66833 257/326 |

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and Nor Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

(56) References Cited

OTHER PUBLICATIONS

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

Lue et al., "A Novel P-Channel NAND-type Flash Memory with 2 bit/cell Operation and High Programming Throughput (> Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., "Novel ZrO2/Si3N4 Dual Charge Storage Layer to Form Step-up Potential Wells for Highly Reliable Multi-level Cell Application", IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

\* cited by examiner

MEMORY CELL STRUCTURES

PRIORITY INFORMATION

This application is a divisional of U.S. application Ser. No. 15/641,475, filed Jul. 5, 2017, the entire contents of which are included herein by reference.

TECHNICAL FIELD

The present disclosure relates generally to memory cells, and, more particularly, to memory cell structures.

BACKGROUND

Memory is sometimes implemented in electronic systems, such as computers, cell phones, hand-held devices, etc. There are many different types of memory, including volatile and non-volatile memory. Volatile memory may require power to maintain its data and may include random access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), or the like. Hard disc drives (HDDs) may be an example of another type of memory and may include magnetic tapes and/or optical discs.

Some electronic systems may include a processor (e.g., for controlling the electronic system). For example, some processors may include SRAM. In some examples, a processor may include a cache memory that may be an SRAM or a DRAM.

The processor may be coupled to data storage devices, such as solid-state-data-storage devices (e.g., sometimes called solid-state drives (SSDs)) and/or hard disc drives. For example, a solid-state-data-storage device might include NAND flash memory, NOR flash memory, and/or NROM.

DETAILED DESCRIPTION

Figure 1:
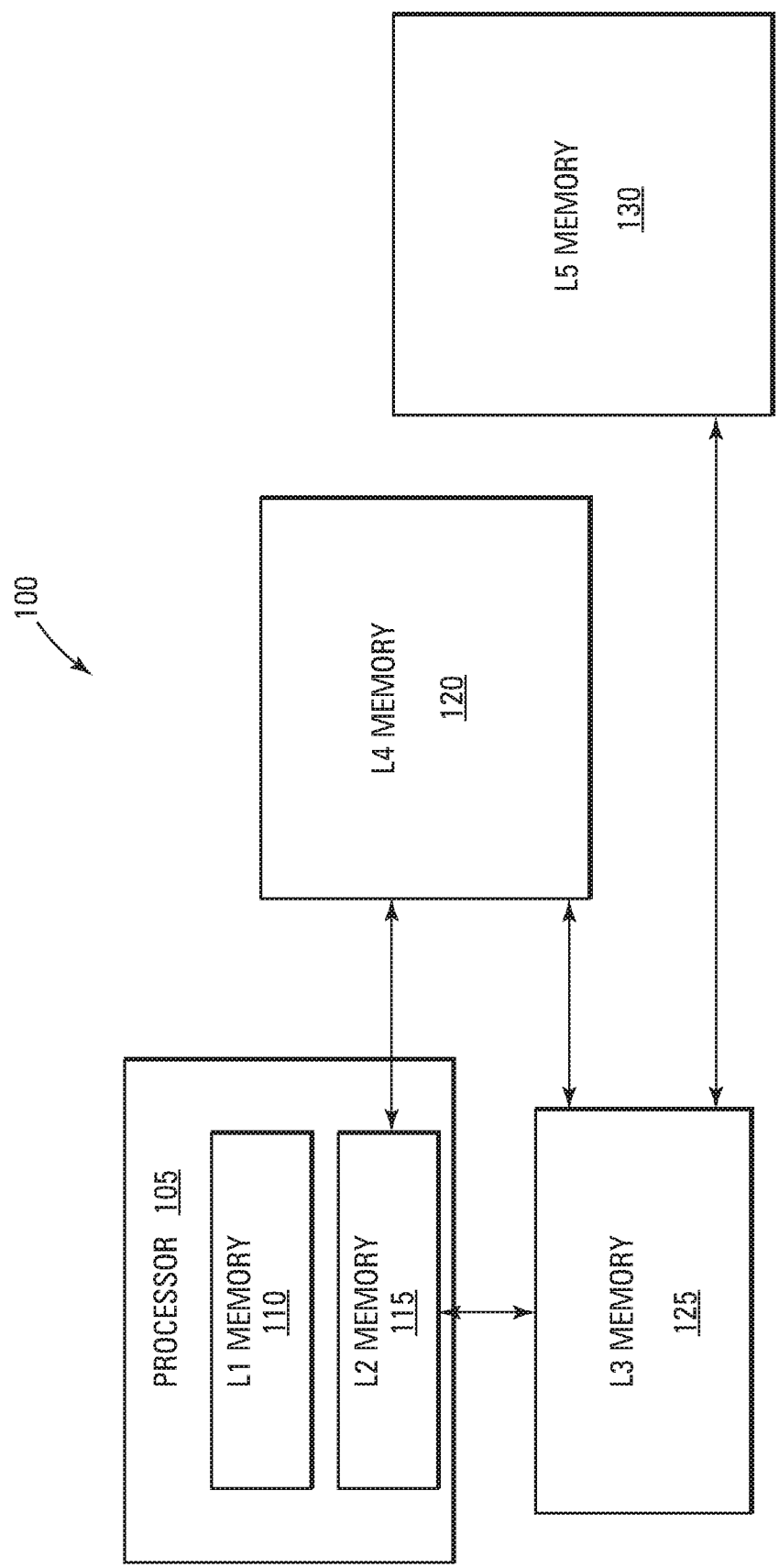
FIG. 1 is a block diagram that illustrates an example of an apparatus in accordance with a number of embodiments of the present disclosure.

In an example, a memory cell may have an interface dielectric adjacent to a semiconductor, a tunnel dielectric adjacent to the interface dielectric, a charge trap adjacent to the tunnel dielectric, a blocking dielectric adjacent to the charge trap, and a control gate adjacent to the blocking dielectric.

A number of embodiments of the present disclosure provide benefits, such as higher programming speed, reduced programming voltages, higher data retention, increased endurance, and reduced energy consumption, as compared to various prior approaches.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a block diagram that illustrates an example of an apparatus in the form of an electronic system 100 in accordance with a number of embodiments of the present disclosure. System 100 can be, for example, a computer system, a memory system, a hand-held device, a cell phone, etc. FIG. 1 illustrates an example of a memory hierarchy associated with electronic system 100. In this example, the memory hierarchy may include levels L1 to L5. As an example, levels L1 to L5 may be defined by memory characteristics (e.g., access speed, and or cycle speed, and or the data throughput, memory cell size, reliability, endurance, volatility, memory-window size, etc.). For example, in going from level L1 to level L5, the access speed, and the cycle speed, and the data throughput may progressively decrease, while the nonvolatility and storage capacity of the memory type may increase.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time. Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For non-volatile memories, for example, the lower the degree of volatility, the longer the memory retains data, and thus the greater the retention. For example, SDDs may, in general, be less nonvolatile compared to HDDs, where HDDs could retain data for centuries in properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as thousand trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 100 may include a processor 105, such as a microprocessor, that may control electronic system 100. Processor 105 may include a memory 110, such as a logic memory, having a memory level L1 For example, a conventional L1-level memory may be an SRAM volatile memory. Processor 105 may also include a memory 115, such as a cache memory, that may have a memory level L2, for example. In some examples, processor 105 may include a built-in memory management unit (MMU) not shown in the drawing. In some examples, the MMU (not shown) may be coupled to L2 and other memory levels. An example of a conventional L2-level memory may be an SRAM volatile cache memory.

Advantages of SRAM may include, for example, high performance (e.g., high data throughput), and high endurance required for L1/L2-level functionality, and ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and volatility.

Memory 115 may be coupled to a memory 120, as shown in FIG. 1. Memory 115 may also be coupled to a memory 125, and memory 125 may be coupled to memory 120, for example. As used in the examples herein, the term "coupled" may include directly coupled and/or directly connected with no intervening elements (e.g., by direct physical contact) or indirectly coupled and/or connected with intervening elements Memory 125 may be a main memory (e.g., a working memory) and may have a memory level L3. An example of a conventional L3-level memory may be a DRAM volatile memory. Advantages of DRAM, for example, may include relatively higher performance compared to non-volatile memories (e.g., read, write, and erase times of less than about 10 nanoseconds), relatively small (e.g., an F×F of about 6 to about 8) one-transistor-one-capacitor memory cells, yielding higher capacity, and relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 120 may be a storage memory (e.g., for storing data and/or code) and may have a memory level L4. Examples of L4-level memory may include non-volatile NOR memory, non-volatile NAND memory, and non-volatile NROM. In some examples, memory 120 may be referred to as a solid-state memory.

Advantages of NROM (e.g., NROM flash) may include, for example, relatively high read performance (e.g., fast reads), non-volatile memory cells, relatively small (e.g., an F×F of about 6) random-access-one-transistor memory cells, multiple-bit-per cell storage capability, basic-input/output-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per $mm^2$ of silicon. Disadvantages of NAND may include, for example, relatively slow write speeds (e.g., about 1.0 to about 10 millisecond), relatively slow access (e.g., serial/parallel memory access), and relatively low write/erase (W/E) endurance (e.g., about $10^3$ to about $10^5$ W/E cycles).

Memory 125 may be coupled a memory 130, having a memory level L5, for example. Examples of conventional L5-level memories may include magnetic memory (e.g., magnetic tapes) and/or optical memory (e.g., optical discs) for storing data. In some examples, memory 130 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. This, for example, may suggest a "one-type-fits-all" approach to memory design (e.g., a novel one-type-fits-all memory). Except for HDD, some processors and memories may (e.g., all) be silicon based, and the memory cell structure may (e.g., all) be similar and may be built using scaled CMOS field-effect transistor technology, for example.

There may be a need for memories that might include silicon-based-non-volatile-one-transistor memory cells that may satisfy the speed, power, and/or capacity requirements of L1-, L2-, L3-, L4-, and L5-level memories. For example, there may be a need for one type of memory cell that may satisfy the speed, power, and/or capacity requirements of L1-, L2-, L3-, L4-, and L5-level memories. There may be a need, for example, for unified technology integration with CMOS logic, such as unified fabrication techniques (e.g., that may be compatible with CMOS fabrication techniques). There may be a need, for example, for scalable and lower-power memories (e.g., memory cells) with higher reliability and durability. There may be a need for all memories to maintain the information or data when there is a loss of power. There may be a need, for example, to do away with the conventional memory hierarchy (e.g., in favor of a non-hierarchical organization) that may result in faster communication with the processor.

Conventional memory requirements and selection, in general, may be based on application, capacity, and power requirements, cost, portability, form factor, and system performance/execution requirements. Some memory parameters, for example, may be cost, form factor, package density, and power consumption. Another parameter in selecting specific memory types and organizing memory use in a specific system, such as electronic system 100, may be data throughput, such as cycle time. For example, data throughput may depend on the intrinsic characteristics of the memory cell.

Cycle time, as mentioned earlier, may strongly impact the time it may take for the processor to fetch a specific bit of data from a specific memory array. Examples of estimated cycle times may include, for example, about 0.5 nanosecond to about 1.0 nanosecond for SRAM, about 5.0 nanoseconds to about 20 nanoseconds for DRAM, about 500 nanoseconds to about 10000 nanoseconds for NROM, and greater than about million nanoseconds for NAND.

The present disclosure includes memory that may include, for example, non-volatile memory cells in which an active element, such as a field-effect transistor, may be integrated with a dielectric stack, that may store a charge in the gate stack of the field-effect transistor. For example, the gate stack may control the entire transistor channel or part of the transistor channel in the memory cell design. In some examples, such a memory might be referred to as silicon-based-unified memory (SUM), such as a uni-functional SUM (USUM). In some examples, the design of the dielectric stack may be varied so that the non-volatile memory cell (e.g., a USUM memory cell) may operate as an L1-, L2-, L3-, L4-, or L5-level memory cell. For example, the memory cells disclosed herein may have higher performance, lower power consumption, and higher reliability than, for example, than some conventional NVM cells. Employing such a memory cell in the framework of sub-arrays and arrays may eliminate the need of conventional memory hierarchy, thereby improving memory and system attributes.

In some examples, field-effect-transistor—(e.g., FET-) based USUM devices may be designed to achieve different functionality, dependent on intrinsic dielectric stack characteristics of a design, by adding or subtracting dielectrics in the dielectric stack. USUM technology may be integrated with the CMOS logic technology, for example, unlike conventional memories, such as DRAM, that may have unique customized integration requirements. USUMs may be differentiated by the attributes of their charge transport, charge storage, and charge retention (e.g., charge blocking) characteristics. For example, the intrinsic memory-cell attributes may be different in terms of programming speed, power, and refresh requirements that may result in cycle-time variations, variations in data throughput and system capability, and differing applicability to replace conventional memories by functionality.

In some examples, some USUMs may have a programming voltage of about 5.0 volts to about 7.5 volts (e.g., compared to about 12 volts or higher for some NROMs and NANDs) and a programming speed of less than about 100 microseconds for two bits per memory cell (e.g., compared to about 1.0 millisecond for one bit per cell for some NROMs). Some USUMs may have an energy consumption of about 50 times less than some NROMs, for example.

In some examples, some USUM memory cells may require a programming peak field lower than 8 MV/cm significantly lower than conventional NVMs. Consequently, in some examples, memory durability known as programming endurance could match those of volatile SRAM and DRAM memories enabling functional replacements of volatile memories in digital systems not currently feasible by conventional NROMs and NAND flash based SSDs.

Some DRAMs may operate at 1.5 volts and may need to be refreshed about every 10 milliseconds, for example. However, some USUMs, for example, may need to be reprogrammed every 10 seconds. Some DRAM memory cells, for example, may require twice as much area as some USUMs.

In various examples, SUM-memory-cell fabrication is compatible with complementary-metal-oxide-semiconductor (CMOS) fabrication techniques. This may allow, for example, the dielectric stack to be fabricated to a desired memory level (L1, L2, L3, L4, or L5) with a minimal number of additional processing steps. Moreover, the SUM memory cells may be scalable to about a five-nanometer feature size. For example, such scaling may be difficult for conventional DRAM designs.

USUM memory cells may be implemented (e.g., in scaled silicon) using, for example, CMOS logic technology and a set of unified and complimentary integration schemes that may eliminate some separate, custom-integration technology practices, such as those currently employed for DRAM (e.g., for L3), and NROM (for code, BIOS, etc.) and NAND-Flash ((e.g., for L4) memory chips. USUM memory cell technology may (e.g., only) add or subtract specific selected dielectrics (e.g., as thin films) in the gate stack design in a unified process integration methodology with the scaled CMOS logic technology to enable functionality equivalence from L1 through L5. This may potentially have, for example, multiple benefits, such as a) technology compatibility, b) productivity, c) enhancement in technology reliability, and d) reduction (e.g., elimination) of interfacing technology and packaging between different memory types and between logic and memories. For example, potential benefits at the system level may include not only process complexity reduction, but also, cost reduction, power reduction, and enhancements in performance, and reliability.

Multiple and wide-ranging memory cell performance and associated data throughput from the memory array may be built into the same USUM cell design (e.g., with complementary input/output logic built into the associated memory array). For example, this may be achieved by integrating dielectrics (e.g., dielectric films) with well-defined intrinsic attributes into the dielectric stack design of an USUM memory cell while using a similar (e.g., the same) technology integration scheme. This may provide, for example, certain functionality and memory capability within a single memory array design that may not be feasible for conventional memories.

USUMs, for example, may allow for similar memory cell designs and array architectures throughout the memory hierarchy that may provide a spectrum of cycle time, latency targets, and data throughput to deliver varying functionality and durability requirements that might be balanced for certain applications. Due to the process commonality, USUM-cell designs might be implemented in different capacity arrays and or subarrays within a single chip or multiple chips to address system cost, power, form-factor, performance, and durability objectives. This may provide more flexibility in system design, for example.

Some USUM memory cell designs, for example, may employ an energy-efficient direct tunneling mechanism to achieve desired system performance and functionality. Some USUM memory cell designs may extend the direct tunnel mechanism further through internal field enhancements by means of appropriately selected multi-layered direct tunneling dielectric films with progressive band-energy offsets coupled with multi-step direct tunneling. For example, this approach may allow additional voltage scalability with higher programming speed for the memory cells, and, consequently, power savings at the desired performance level, that may be difficult to achieve using conventional memories and hierarchical memory designs of comparable performance and applicability.

Band-engineered USUM memory cells, for example, may employ stack design and tailored programming to establish targeted speed-retention tradeoffs towards achieving the system data-rate throughput (L1/L2/L3/L4 functionality) for effective execution of functions. For example, this approach may reduce data transmission delays, and thus increase data availability, at appropriate processing nodes, reduce prefetch data storage requirements, reduce machine cycle time for execution of functions, reduce data refresh requirements, reduce complexity in bus design, etc.

USUM-memory-cell designs may provide, for example, unique sets of functional attributes via dielectric stack designs for FET based charge-trap memory cells. For example, the USUM memory cell and array design may have the potential to create superior digital systems with flexible design attributes to broaden application base not cost-effective with conventional approaches.

Figure 2A:
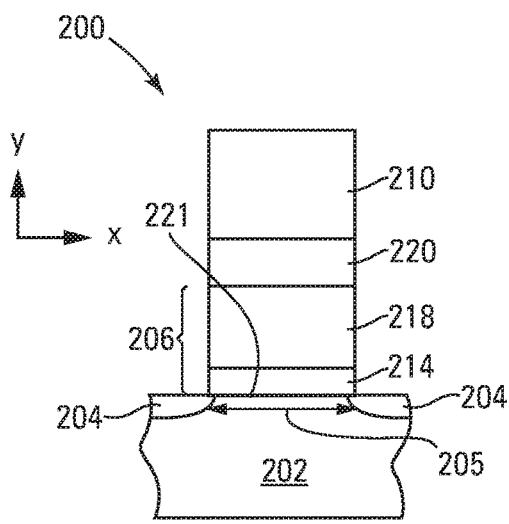
FIG. 2A illustrates an example of a transistor in accordance with a number of embodiments of the present disclosure.

FIG. 2A illustrates an example of a (e.g., scaled) transistor 200, such as a field-effect transistor, that may be a (e.g., CMOS) logic transistor, for example, in accordance with a number of embodiments of the present disclosure. Transistor 200 may be adjacent to (e.g., over) a semiconductor 202, such as single crystal p⁻ silicon. Source/drains 204 (e.g., $n^+$-type diffusion regions) may be in semiconductor 202. Transistor 200 may include a (e.g., memory cell-compatible) dielectric stack 206 adjacent to semiconductor 202 and source/drains 204. A control gate 210 may be placed over the dielectric stack 206, and may, for example, be metal (e.g., tungsten, aluminum, etc.), or polysilicon (e.g., doped polysilicon, such as $n^+$-doped polysilicon), etc., with an appropriate interface metallic, such as interface metallic 220, between the dielectric stack 206 and control gate 210 to achieve the desired value of the threshold of the field-effect-transistor.

In some examples, dielectric stack 206 may include an interface dielectric 214 (e.g., of oxygen-rich silicon oxynitride (OR—SiON) having a dielectric constant (K) of about 5.0) adjacent to semiconductor 202 and source/drains 204. Interface dielectric 214 may act as a silicon-interface dielectric, such as a part of a gate dielectric, of transistor 200, for example. A high-K blocking dielectric 218 (e.g., of hafnium tantalum oxynitride (HfTaON) having a K of about 18) may be adjacent to the interface dielectric 214 and together with interface dielectric 214 may form a double layer gate dielectric for the field effect transistor. The interface metallic 220 (e.g., tantalum nitride (TaN)) may be adjacent to blocking dielectric 218. Note, for example, that control gate 210 may be adjacent to interface metallic 220, and interface metallic 220 may act as a barrier between control gate 210 and blocking dielectric 218. In some examples, interface metallic 220 may act to create, at least in part, the threshold of transistor 200 by controlling the metal-insulator work function of a gate stack of transistor 200 that may include, for example, interface dielectric 214, blocking dielectric 218, interface metallic 220, and control gate 210.

In an example, the interface dielectric 214 might be about 1.0 nanometer to about 1.5 nanometers thick, and the blocking dielectric 218 might be about 6.0 nanometers thick. The thicknesses herein may be in the y-direction, such as the direction from an upper (e.g., topmost) surface 221 of semiconductor 202, that is perpendicular to the x-direction, such as the direction from one source/drain 204 to the other source/drain 204. For example, during operation of a transistor 200 or the memory cells 222, 240, and/or 250 discussed in the examples below, a channel 205 may be formed in semiconductor 202 between source/drains 204 that may be parallel to the x-direction and perpendicular to the y-direction. It should be recognized the terms perpendicular and parallel respectively account for variations from "exactly" perpendicular and "exactly" parallel due to routine manufacturing, measuring, and/or assembly variations and that one of ordinary skill in the art would know what is meant by the terms perpendicular and parallel.

Figure 2B:
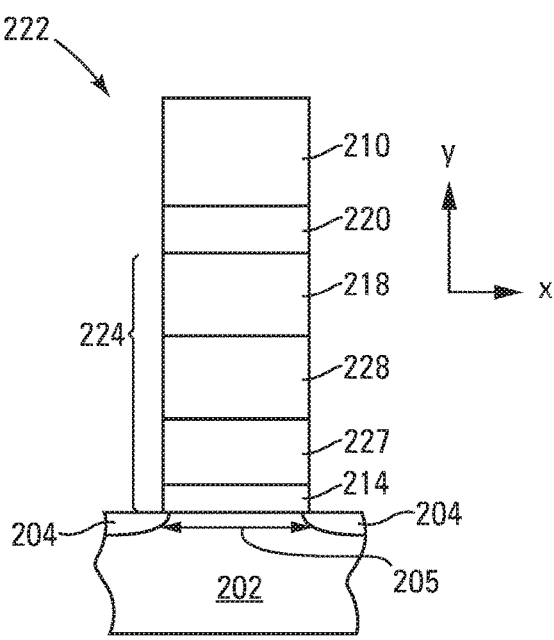
FIG. 2B illustrates an example of a non-volatile memory cell in accordance with a number of embodiments of the present disclosure.

FIG. 2B illustrates an example of a non-volatile memory cell 222 in accordance with a number of embodiments of the present disclosure. For example, FIG. 2B illustrates an example of a gate stack structure of non-volatile memory cell 222 in accordance with a number of embodiments of the present disclosure. In the example of FIG. 2B, additional dielectrics may be added to the dielectric stack 206 of transistor 200 to form a non-volatile dielectric stack 224 (e.g., extending in the y-direction from the upper surface 221 of semiconductor 202) of memory cell 222 to store a charge. In some examples, memory cell 222 may be used as an L1-level memory cell, such as an L1-level USUM cell (e.g., that may replace an SRAM memory cell, such as in memory 110 in FIG. 1). In other examples, memory cell 222 may be used as an L2-level memory cell, such as an L2-level USUM cell (e.g., that may replace an SRAM memory cell, such as in memory 115 in FIG. 1). For example, Table 1 provides an example of a dielectric stack 224 for an L1/L2-level memory cell (e.g., that may be optimized for programming speed).

TABLE 1

Example of a dielectric stack 224 (FIG. 2B) for an L1/L2-Level Memory Cell

| Interface Dielectric 214 | Tunnel Dielectric 227 | Charge Trap 228 | Blocking Dielectric 218 |
|---|---|---|---|
| OR-SiON 1 nm | HfTaON 2 nm | GaN 4 nm | HfTaON 6 nm |

Dielectric stack 224 may include, for example, the interface dielectric 214 that may act as an interface tunnel dielectric of memory cell 222. For example, interface dielectric 214 may be about 1.0 nanometer thick. Interface dielectric 214 may be OR—SiON, for some examples.

A tunnel dielectric 227, such as HfTaON, may be adjacent to interface dielectric 214 in dielectric stack 224. For example, tunnel dielectric 227 might be about 2.0 nanometers thick for memory cell 222 (e.g., an L1/L2-level memory cell). A charge trap 228, such as gallium nitride (GaN) having a K of about 10, may be adjacent to tunnel dielectric 227 and, for example, may have a thickness of about 4.0 nanometers.

The blocking dielectric 218, as described above in conjunction with transistor 200 in FIG. 2A, may be adjacent to charge trap 228 in dielectric stack 224. The interface metallic 220, as described above in conjunction with transistor 200 in FIG. 2A, may be adjacent to blocking dielectric 218, and thus dielectric stack 224. The control gate 210, as described above in conjunction with transistor 200 in FIG. 2A, may be adjacent to interface metallic 220.

In some examples, interface dielectric 214 may be in direct physical contact with semiconductor 202, tunnel dielectric 227 in direct physical contact with interface dielectric 214, charge trap 228 in direct physical contact with tunnel dielectric 227, blocking dielectric 218 in direct physical contact with charge trap 228, interface metallic 220 in direct physical contact with blocking dielectric 218, and thus dielectric stack 224, and control gate 210 in direct physical contact with interface metallic 220. Interface metallic 220, for example, may act to create, at least in part, a threshold of memory cell 222 by controlling the metal-insulator work function of a gate stack of memory cell 222 that may include, for example, the dielectric stack 224, interface metallic 220, and control gate 210.

In some examples, such as the example of Table 1, the effective oxide thickness (EOT) of dielectric stack 224 might be about 4.0 nanometers, where the EOT is the thickness that silicon dioxide ($SiO_2$) would need to be to have the capacitance of a material or stack of materials. For example, a dielectric stack 224 having an EOT of about 4.0 nanometers means that the capacitance of dielectric stack 224 is the capacitance of about 4.0 nanometers of $SiO_2$. The EOT of the combined tunnel dielectrics 214 and 227 (e.g., tunnel EOT), such as for the example of Table 1, may be about 1.3 nanometers (e.g., about 1.25 nanometers).

The program/erase time for a memory cell 222 (e.g., having the dielectric stack 224 in the example of Table 1) might be about less than 25 nanoseconds for a program/erase voltage of about ±3.0 V, for example. It should be noted, for example, that such a (e.g., fast) programming speed may be achieved, at least in part, through internal field enhancement of direct tunneling electrons after the electronic charges tunnel through the interface layer 214 and get accelerated due to the conduction band energy lowering (band energy offset) of the (e.g., direct) tunnel dielectric 227. For example, this may be called a progressive band offset (PBO) SUM stack design for the tunneling part of the stack 224.

For some examples, such as for the example of Table 1, the initial memory window of memory cell 222 might be about 2.0 V, and the end-of-life memory window might be about 1.0 V. The end-of-life endurance of memory cell 222, for some examples, such as the example of Table 1, may be greater than about 10 billion write/erases, compared to about a million write/erases for conventional non-volatile memory cells. The retention of memory cell 222, for some examples, such as the example of Table 1, may be on the order of hours. The peak write/erase field (e.g., a measure of the charge transport energy) of memory cell 222, for some examples, such as the example of Table 1, may be less than about 7.5 megavolts/centimeter, compared with about 12.0 megavolts/centimeter to about 15.0 megavolts/centimeter for conventional nonvolatile memory cells.

Note that non-volatile memory cell 222 may be created from the basic transistor 200 by adding tunnel dielectric 227 and charge trap 228 to the dielectric stack 206 of transistor 200 to create the dielectric stack 224 of memory cell 222. For example, non-volatile memory cell 222 may be said to be transistor (e.g., FET) based.

Dielectric stack 224 may be modified, in some examples, by introducing a (e.g., an ultra-thin) storage dielectric (e.g., about 1.0 to 1.5 nanometers of injector silicon-rich nitride (i-SRN)) between tunnel dielectric 227 and charge trap 228. The role of such a storage dielectric (e.g., and i-SRN) is further discussed in the examples below.

Figure 2C:
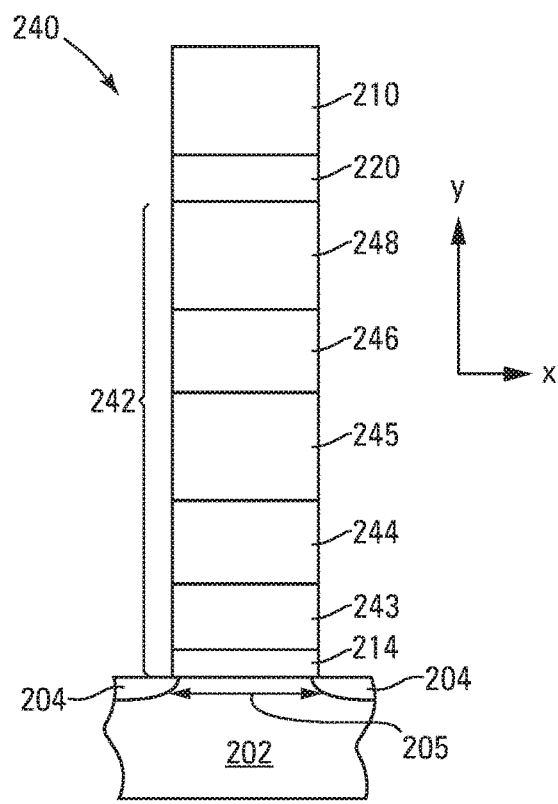
FIG. 2C illustrates another example of a non-volatile memory cell in accordance with a number of embodiments of the present disclosure.

FIG. 2C illustrates an example of a non-volatile memory cell 240 in accordance with a number of embodiments of the present disclosure. For example, FIG. 2C illustrates an example of a gate stack structure of non-volatile memory cell 240 in accordance with a number of embodiments of the present disclosure (e.g., optimized to meet functionality requirements of a working memory with extended refresh time). In the example of FIG. 2C, additional dielectrics may be added to the dielectric stack 206 of transistor 200 to form a non-volatile dielectric stack 242 (e.g., extending in the y-direction from the upper surface 221 of semiconductor 202) of memory cell 240 to store a charge. In some examples, memory cell 240 may be used as an L3-level memory cell, such as an L3-level USUM cell (e.g., that may replace a DRAM volatile memory cell, such as in memory 125 in FIG. 1). For example, Table 2 provides an example of a dielectric stack 242 for an L3-level memory cell.

TABLE 2

Example of a dielectric stack 242 (FIG. 2C) for an L3-Level Memory Cell

| Interface dielectric 214 | Storage Dielectric 243 | Tunnel Dielectric 244 | Charge Trap 245 | Storage Dielectric 246 | Blocking Dielectric 248 |
|---|---|---|---|---|---|
| OR-SiON 1-1.5 nm | i-SRN 1 nm | HfLaON 3 nm | GaN 5 nm | i-SRN 3 nm | HfLaON 6 nm |

Dielectric stack 242 may include, for example, the interface dielectric 214 (e.g., that may act as an interface tunnel dielectric of memory cell 240) adjacent to (e.g., over) semiconductor 202 and source drains 204, except that the thickness of dielectric 214 might be about 1.0 nanometers to about 1.5 nanometers for the L3-level memory cell 240, as opposed to about 1.0 nanometer for the L1/L2-level memory cell 222. A (e.g., an ultra-thin) storage dielectric 243 (e.g., silicon-rich nitride (SRN) that may contain silicon nano-particles in nitride) may be adjacent to interface dielectric 214 in dielectric stack 242. For example, storage dielectric 243 might be about 1.0 nanometer thick and, for example, may have silicon nano-particles (e.g., with a diameter of about 1.0 nanometer) in nitride.

Storage dielectric 243, for example, might be referred to as an injector dielectric (e.g., an injector-silicon-rich nitride (i-SRN)). For example, the storage dielectric 243 may act as an internal "electro-static-potential-modulator." In some examples, storage dielectric 243 may temporarily store some electronic charge and may act as a barrier to reduce charge leakage from memory cell 242 to the silicon substrate during the higher threshold standby state of the memory cell. Thereby, such a dielectric stack design may extend the refresh time for the L3 functionality, for example.

A tunnel dielectric 244, such as hafnium lanthanum oxynitride (HfLaON) having a K of about 20, may be adjacent to storage dielectric 243 in dielectric stack 242. However, in other examples, tunnel dielectric 244 may be HfTaON. Tunnel dielectric 244 might be about 3.0 nanometers thick for memory cell 240 (e.g., an L3-level memory cell) in some examples. A charge trap 245, such as gallium nitride (GaN), may be adjacent to tunnel dielectric 243 and, for example, may have a thickness of about 5.0 nanometers. Note, for example, that the charge trap 245 may be a thicker version of the charge trap 228 discussed above in conjunction with FIG. 2B and Table 1.

A storage (e.g., charge storage reservoir) dielectric 246 (e.g., i-SRN) may be adjacent to charge trap 245 in dielectric stack 242. For example, storage dielectric 246 might be about 3.0 nanometers thick. Storage dielectric 246 may act as a storage reservoir and may store charge (e.g., from semiconductor 202) in addition to charge trap 245, and may thus act to increase the memory window. The trap depth of charge trap 245 may be greater than storage dielectric 246, for example, and thus greater energy may be required to free charges from charge trap 245 than from storage dielectric 246. Electronic stored charges in (e.g., a silicon nano-crystal potential well within) the storage dielectric 243 (e.g., where the thickness of storage dielectric 243 may be about the same as the silicon nano crystal diameter) may generate a negative electrostatic potential. Thus, storage dielectric 243 may act, for example, to cause a reduction in the reverse tunneling field generated due to the combined electronic charges stored in the charge trap 245 and the storage dielectric 246 (e.g., that may be due to prior writing of the memory cell), such as during any standby state of the memory.

A blocking dielectric 248, such as HfLaON, may be adjacent to storage dielectric 246 in dielectric stack 242. However, in other examples, blocking dielectric 248 may be HfTaON. Blocking dielectric 248 may be about 6.0 nanometers thick, in some examples. The interface metallic 220, as described above in conjunction with transistor 200 in FIG. 2A, may be adjacent to blocking dielectric 248, and thus dielectric stack 242. The control gate 210, as described above in conjunction with transistor 200 in FIG. 2A. Interface metallic 220, for example, may act to create, at least in part, a threshold of memory cell 240 by controlling the metal-insulator work function of a gate stack of memory cell 240 that may include, for example, the dielectric stack 242, interface metallic 220, and control gate 210.

In some examples, interface dielectric 214 may be in direct physical contact with semiconductor 202, storage dielectric 243 in direct physical contact with interface dielectric 214, tunnel dielectric 244 in direct physical contact with storage dielectric 243, charge trap 245 in direct physical contact with tunnel dielectric 244, storage dielectric 246 in direct physical contact with charge trap 245, blocking dielectric 248 in direct physical contact with storage dielectric 246, interface metallic 220 in direct physical contact with blocking dielectric 248, and control gate 210 in direct physical contact with interface metallic 220.

In some examples, such as the example of Table 2, the EOT of the dielectric stack of the resulting L3-level non-volatile memory cell may be about 6.0 nanometers; the EOT of the combined tunnel dielectrics 214 and 244 may be less than about 1.5 nanometers; and the program/erase time of the resulting L3-level non-volatile memory cell might be less than about 100 nanoseconds for a program/erase voltage of about ±4.5 V. Moreover, the resulting L3-level non-volatile memory cell, for some examples, such as the example of Table 2, may have an end-of-life endurance of about greater than 1000 billion write/erases, a retention on the order of days, and a peak write/erase field less than about 7.5 megavolts/centimeter. The initial memory window of the resulting L3-level non-volatile memory cell, for some examples, such as the example of Table 2, might be greater than about 3.0 V, and the end-of-life memory window might be greater than about 1.5 V.

Note that adjusting the dielectric stack 224 to create the dielectric stack 242 changes the L1/L2 functionality of memory cell 222 to the L3 functionality of memory cell 240. This is may be an advantageous characteristic USUM technology, for example. For example, the storage dielectrics 243 and 246, the tunnel dielectric 244, and the blocking dielectric 248 in dielectric stack 242 may act to produce the increased retention and memory window of memory cell 240 at the expense of the speed (e.g., program/erase time) compared to the stack design option for the memory cell 222.

Note that non-volatile memory cell 240 may be created from the basic transistor 200 by adding storage dielectric 243, tunnel dielectric 244, charge trap 245, and storage dielectric 246 to the dielectric stack 206 of transistor 200 and replacing blocking dielectric 218 in the dielectric stack 206 of transistor 200 with blocking dielectric 248 to create the dielectric stack 242 of memory cell 240. For example, non-volatile memory cell 240 may be said to be transistor based. This is may be an advantageous characteristic USUM technology, for example.

Figure 2D:
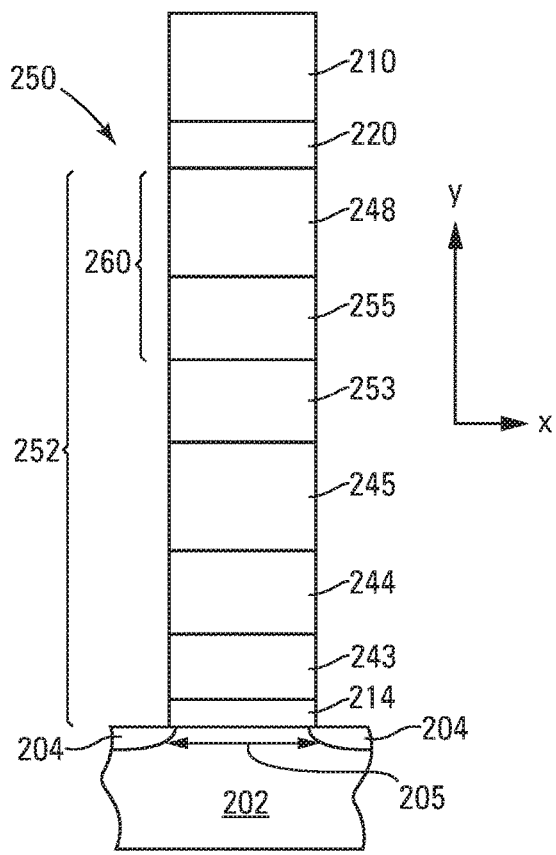
FIG. 2D illustrates another example of a non-volatile memory cell in accordance with a number of embodiments of the present disclosure.

FIG. 2D illustrates an example of a non-volatile memory cell 250 in accordance with a number of embodiments of the present disclosure. For example, FIG. 2C illustrates an example of a gate stack structure of non-volatile memory cell 250 in accordance with a number of embodiments of the present disclosure. In the previous example of FIG. 2C, additional dielectrics are added to the dielectric stack 206 of transistor 200 to form a non-volatile dielectric stack 252 (e.g., extending in the y-direction from the upper surface 221 of semiconductor 202) of memory cell 250 to store a charge. In some examples, memory cell 250 may be an L4-level memory cell, such as an L4-level USUM cell, that may replace conventional NAND non-volatile memory cells (e.g., to store data) and/or conventional NROM non-volatile memory cells (e.g., to store code and/or to perform BIOS functions). For example, Table 3 illustrates an example of a dielectric stack 252 for an L4-level memory cell.

threshold of memory cell 250 by controlling the metal-insulator work function of a gate stack of memory cell 240 that may include, for example, the dielectric stack 252, interface metallic 220, and control gate 210.

In some examples, interface dielectric 214 may be in direct physical contact with semiconductor 202, storage dielectric 243 in direct physical contact with interface dielectric 214, tunnel dielectric 244 in direct physical contact with storage dielectric 243, charge trap 245 in direct physical contact with tunnel dielectric 244, storage dielectric 253 in direct physical contact with charge trap 245, blocking dielectric 255 in direct physical contact with storage dielectric 253, blocking dielectric 248 in direct physical contact with blocking dielectric 255, interface metallic 220 in direct physical contact with blocking dielectric 248, and control gate 210 in direct physical contact with interface metallic 220.

TABLE 3

Example of a dielectric stack 252 (FIG. 2D) for an L4-Level Memory Cell

| Interface dielectric 214 | Storage Dielectric 243 | Tunnel Dielectric 244 | Charge Trap 245 | Storage Dielectric 253 | Blocking Dielectric 255 | Blocking Dielectric 248 |
|---|---|---|---|---|---|---|
| OR-SiON 1-1.5 nm | i-SRN 1 nm | HfLaON 3 nm | GaN 5 nm | i-SRN 5 nm | $Al_2O_3$ 4 nm | HfLaON 6 nm |

Dielectric stack 252 may include, for example, the interface dielectric 214 (e.g., as described above in conjunction with FIG. 2C and Table 2 that, for example, may act as an interface tunnel dielectric of memory cell 250) adjacent to (e.g., over) semiconductor 202 and source/drains 204, the storage dielectric 243 adjacent to interface dielectric 214, the tunnel dielectric 244 adjacent to storage dielectric 243, and the charge trap 245 adjacent to tunnel dielectric 244.

A storage dielectric 253 (e.g., that may be about 5.0 nanometers thick), such as i-SRN, may be adjacent to charge trap 245. Note, for example, that the storage dielectric 253 may be a thicker version of the storage dielectric 246 discussed above in conjunction with FIG. 2C and Table 2. Storage dielectric 253 may act as a storage reservoir and may store charge in addition to charge trap 245, and may thus act to increase the memory window. A blocking dielectric 255 may be adjacent to storage dielectric 253 in dielectric stack 252, for example. In some examples, blocking dielectric 255 may be aluminum oxide ($Al_2O_3$) having a K of about 10 and, for example, a thickness of about 4.0 nanometers.

In examples where the blocking dielectric 255 is aluminum oxide the aluminum oxide may react with the storage dielectric 253 (e.g., the i-SRN) to provide a (e.g. a relatively high density of) fixed (e.g., to within routine variations) negative charge at the mutual interface of storage dielectric 253 and blocking dielectric 255. This fixed negative charge along with the (e.g., relatively) high barrier electronic energy of the $Al_2O_3$ conduction band provides a (e.g., significantly) larger memory window of the memory cell as well as enhanced retention due to reduced leakage of charges to the control gate 210.

The blocking dielectric 248 may be adjacent to blocking dielectric 255 in dielectric stack 252. The interface metallic 220 may be adjacent to blocking dielectric 248, and thus dielectric stack 252. The control gate 210 may be adjacent to (e.g., over) the interface metallic 220. Interface metallic 220, for example, may act to create, at least in part, a In some examples, a blocking dielectric 260 may be between storage dielectric 253 and interface metallic 220 (e.g., and in direct physical contact with storage dielectric 253 and interface metallic 220). For example, blocking dielectric 260 may include blocking dielectric 255 over storage dielectric 253 and blocking dielectric 248 over blocking dielectric 255, as shown in FIG. 2D. For other examples, blocking dielectric 260 may include blocking dielectric 248 over (e.g., and in direct physical contact with) storage dielectric 253 and blocking dielectric 255 over (e.g., and in direct physical contact with) blocking dielectric 248, where, for example, interface metallic 220 might be over (e.g., and in direct physical contact with) blocking dielectric 255.

In some examples, such as the example of Table 3, the EOT of dielectric stack 252 may be about 9.5 nanometers; the EOT of the combined tunnel dielectrics 214 and 244 may be about 2.0 nanometers; and the program/erase time of memory cell 250 might be less than about 100 nanoseconds for a program/erase voltage of about ±6.0 V. Moreover, memory cell 250, for some examples, such as the example of Table 3, may have an end-of-life endurance of about greater than 10 billion write/erases, a retention greater than about 10 years, and a peak write/erase field less than about 7.5 megavolts/centimeter. The initial memory window of memory cell 250, for some examples, such as the example of Table 3, might be greater than about 6.0 V, and the end-of-life memory window might be greater than about 4.0 V, for example.

Note that adjusting the dielectric stack 224 to create the dielectric stack 252 changes the L1/L2 functionality of memory cell 222 to the L4 functionality of memory cell 250. This is may be an advantageous characteristic USUM technology, for example. For example, the storage dielectrics 243 and 253, the tunnel dielectric 244, and the blocking dielectric 248 in dielectric stack 252 may act to produce the increased retention and increased memory window of memory cell 250 at the expense of the speed (e.g., program/ erase time) of memory cell 222. Moreover, adjusting the dielectric stack 242 to create dielectric stack 252 changes L3 functionality of memory cell 240 to the L4 functionality of memory cell 250. For example, the storage dielectric 253 and the blocking dielectric 255 may act to produce the increased retention and increased memory window of memory cell 250 compared to memory cell 240. The increased memory window may provide, for example, the capability of multi-level storage within the memory cell, thus enhancing the memory storage (e.g., causing the memory storage capacity to be doubled or tripled).

Non-volatile memory cell 250 may be created from the basic transistor 200 by adding storage dielectric 243, tunnel dielectric 244, charge trap 245, storage dielectric 253, and blocking dielectric 255 to the dielectric stack 206 of transistor 200 and replacing blocking dielectric 218 in the dielectric stack 206 of transistor 200 with blocking dielectric 248 to create the dielectric stack 252 of transistor 250. Note that in some examples, the dielectric stacks discussed above in conjunction with FIGS. 2A-2D (e.g., dielectric stacks 206, 224, 242, and 252) may be formed by a single machine (e.g., a single low-pressure-chemical-vapor-deposition (CVD) system) that can reduce fabrication cost.

In some examples, an integration scheme may be adopted that would first define the L1/L2-, L3-, and L4-level non-volatile memory array regions. Interface dielectric 214 may then be formed in the defined L1/L2-memory region (e.g., concurrently) with forming (e.g., a thickness of) interface dielectric 214 in the L3- and L4-level memory array regions (e.g., over semiconductor 202). Subsequently, the L1/L2-level memory array region (e.g., interface dielectric 214 in the L1/L2-level memory array region) may be protected while an additional thickness of interface dielectric 214 is formed (e.g., concurrently) in the L3- and L4-level memory array regions, if desired, for example, (e.g., over the thickness of interface dielectric 214 previously formed in the L3- and L4-level memory array regions).

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

Storage dielectric 243 may then be formed (e.g., over interface dielectric 214) in the L3- and L4-level memory array regions (e.g., concurrently) while protecting (e.g., interface dielectric 214 in) the L1/L2-level memory array region. Then, tunnel dielectric 227 may be formed (e.g., over interface dielectric 214) in the L1/L2-level memory array region while protecting (e.g., storage dielectric 243 in) the L3- and L4-level memory array regions. Tunnel dielectric 244 may then be formed (e.g., concurrently) in the L3- and L4-level memory array regions (e.g., over storage dielectric 243) while protecting (e.g., tunnel dielectric 227 in) the L1/L2-level memory array region.

In other examples, tunnel dielectric 227 may be formed (e.g., over interface dielectric 214) in the L1/L2-level memory array region while protecting (e.g., interface dielectric 214 in) the L3- and L4-level memory array regions. Then, storage dielectric 243 may be formed (e.g., over interface dielectric 214) in the L3- and L4-level memory array regions (e.g., concurrently) while protecting (e.g., tunnel dielectric 227 in) the L1/L2-level memory array region. Tunnel dielectric 244 may then be formed (e.g., over storage dielectric 243) in the L3- and L4-level memory array regions (e.g., concurrently) while protecting (e.g., tunnel dielectric 227 in) the L1/L2-level memory array region.

Charge trap 228 may then be formed in the L1/L2-level memory array region (e.g., over tunnel dielectric 227) while (e.g., concurrently) forming (e.g., a thickness of) charge trap 228 in the L3- and L4-level memory array regions (e.g., over tunnel dielectric 244). The process may be repeated by protecting (e.g., charge trap 228 in) the L1/L2-level memory array region while an additional thickness of charge trap 228 is formed (e.g., over the thickness of charge trap 228 previously formed in) the L3- and L4-level memory array regions to form charge trap 245.

Storage dielectric 246 may then be formed in the L3-level memory array while (e.g., concurrently) forming (e.g., a thickness of) storage dielectric 246 in the L4-level memory array region while protecting (e.g., charge trap 228 in) the L1/L2-level memory array region. The process may be repeated by protecting (e.g., charge trap 228 in) the L1/L2-level memory array region and by protecting (e.g., storage dielectric 246 in) the L3-level memory array region while an additional thickness of storage dielectric 246 is formed (e.g., over the thickness of storage dielectric 246 previously formed) in the L4-level memory array region to form dielectric 253.

Then, blocking dielectric 218 may be formed (e.g., over charge trap 228) in the L1/L2-level memory array region while protecting (e.g., storage dielectric 246 in) the L3-memory array region and (e.g., storage dielectric 253 in) the L4-level memory array region. Then, in some examples, (e.g., blocking dielectric 218 in) the L1/L2-memory array region and (e.g., storage dielectric 246 in) the L3-memory array region may be protected while forming blocking dielectric 255 (e.g., over storage dielectric 253) in the L4-level memory array region. Then, blocking dielectric 248 may be formed (e.g., concurrently) in the L4-level memory array region (e.g., over blocking dielectric 255) and (e.g., over storage dielectric 246) in the L3-level memory array region while protecting (e.g., blocking dielectric 218 in) the L1/L2-level memory array region. Interface metallic 220 may be formed (e.g., concurrently) in the L1/L2-memory regions (e.g., over blocking dielectric 218) and in the L3- and L4-level memory array regions (e.g., over blocking dielectric 248). Then, control gate 210 may be formed (e.g., concurrently) in the L1/L2-, L3-, and L4-level memory array regions (e.g., over interface metallic 220).

In other examples, (e.g., blocking dielectric 218 in) the L1/L2-level memory array region may be protected while forming (e.g., concurrently) blocking dielectric 248 in the L3-level memory array region (e.g., over storage dielectric 246) and the L4-level memory array region (e.g., over storage dielectric 253). Then, (e.g., blocking dielectric 218 in) the L1/L2-level memory array region and (e.g., blocking dielectric 248 in) the L3-level memory array region may be protected while forming blocking dielectric 255 in the L4-level memory array region (e.g., over blocking dielectric 248). Interface metallic 220 may be formed (e.g., concurrently) in the L1/L2-memory regions (e.g., over blocking dielectric 218), in L3-level memory array region (e.g., over blocking dielectric 248), and L4-level memory array region (e.g., over blocking dielectric 255). Then, control gate 210 may be formed (e.g., concurrently) in L1/L2-, L3-, and L4-level memory array regions (e.g., over interface metallic 220).

In some examples, blocking dielectric 248 may be formed (e.g., concurrently) in the L3-level memory array region (e.g., over storage dielectric 246) and the L4-level memory array region (e.g., over storage dielectric 253) while protecting (e.g., charge trap 228 in) the L1/L2-memory array region. Then, blocking dielectric 218 may be formed (e.g., over charge trap 228) in the L1/L2-level memory array region while protecting (e.g., blocking dielectric 248 in) the L3- and L4-level memory array regions. Then, (e.g., blocking dielectric 218 in) the L1/L2-level memory array region and (e.g., blocking dielectric 248 in) the L3-level memory array region may be protected while forming blocking dielectric 255 in the L4-level memory array region (e.g., over blocking dielectric 248).

In other examples, (e.g., charge trap 228 in) the L1/L2-memory array region and (e.g., storage dielectric 246 in) the L3-memory array region may be protected while forming blocking dielectric 255 (e.g., over storage dielectric 253) in the L4-level memory array region. Then, blocking dielectric 248 may be formed (e.g., concurrently) in the L4-level memory array region (e.g., over blocking dielectric 255) and (e.g., over storage dielectric 246) in the L3-level memory array region while protecting (e.g., charge trap 228 in) the L1/L2-level memory array region. Then, blocking dielectric 218 may be formed (e.g., over charge trap 228) in the L1/L2-level memory array region while protecting (e.g., blocking dielectric 248 in) the L3- and L4-level memory array regions.

In further examples, (e.g., charge trap 228 in) the L1/L2-memory array region and (e.g., storage dielectric 246 in) the L3-memory array region may be protected while forming blocking dielectric 255 (e.g., over storage dielectric 253) in the L4-level memory array region. Then, blocking dielectric 218 may be formed (e.g., over charge trap 228) in the L1/L2-level memory array region while protecting (e.g., storage dielectric 246 in) the L3-memory array region and (e.g., blocking dielectric 255 in) the L3- and L4-level memory array regions. Then, blocking dielectric 248 may be formed (e.g., concurrently) in the L4-level memory array region (e.g., over blocking dielectric 255) and (e.g., over storage dielectric 246) in the L3-level memory array region while protecting (e.g., charge trap 228 in) L1/L2-level memory array region. Then, blocking dielectric 218 may be formed (e.g., over charge trap 228) in the L1/L2-level memory array region while protecting (e.g., blocking dielectric 248 in) the L3- and L4-level memory array regions.

In some examples, the relatively low peak write/erase fields of the dielectric stacks of the memory cells discussed above in conjunction with FIGS. 2B-2D (e.g., less than about 7.5 megavolts/centimeter compared with about 12.0 megavolts/centimeter to about 15.0 megavolts/centimeter for conventional nonvolatile memory cells) can result in the relatively large end-of-life endurance for the memory cells discussed above (e.g., about greater than 10 billion write/erases, compared to about a million write/erases for conventional non-volatile memory cells). Also note that the program/write voltages of about ±3.0 V for the L1/L2-level memory cell, about ±4.5 V for the L3-level memory cell, and about ±6.0 V for the L4-level memory cell are significantly lower than program/write voltage of at least about ±12 V for some conventional non-volatile memory cells, such as conventional non-volatile NAND memory cells.

Figure 2E:
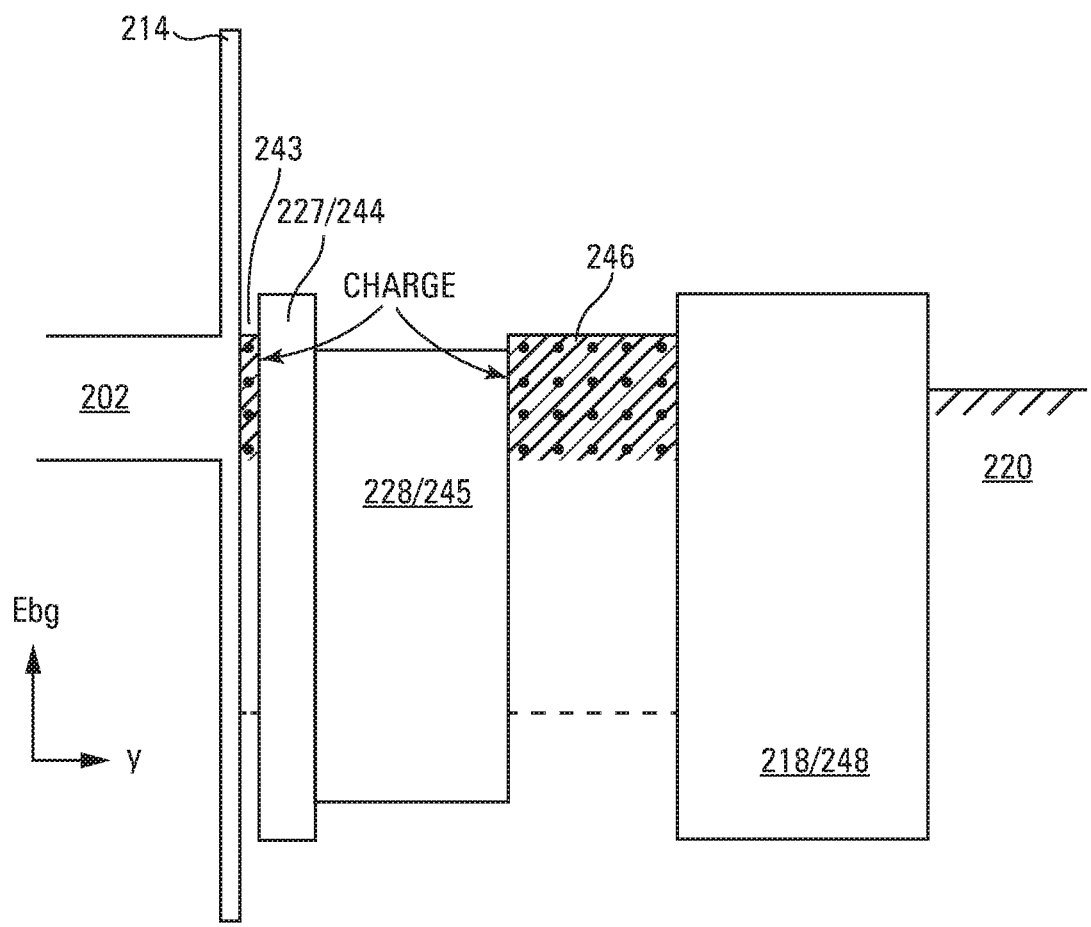
FIG. 2E is an example of a band-offset diagram for a dielectric stack in accordance with a number of embodiments of the present disclosure.

FIG. 2E is an example of a band-gap-energy—(Ebg) offset diagram of a dielectric stack, such as either dielectric stack 224 in the example of FIG. 2B and Table 1 or dielectric stack 242 in the example of FIG. 2C and Table 2, in accordance with a number of embodiments of the present disclosure. For example, FIG. 2E may show the Ebg as a function of the distance in the y-direction from semiconductor 202, e.g., in the absence of a voltage being applied to the memory cell with either dielectric stack 224 or dielectric stack 242. The reference numbers associated with the energy bands in FIG. 2E correspond to the reference numbers that identify the dielectrics in either FIG. 2B or FIG. 2C.

Note that dielectric stack 224 might not include storage dielectric 243 (e.g., i-SRN) and storage dielectric 246 (e.g., i-SRN). Therefore, these dielectrics might be omitted from FIG. 2E for dielectric stack 224, for example. Also note that the tunnel dielectric 227 and the blocking dielectric 218 in dielectric stack 224 might be HfTaON, whereas the tunnel dielectric 244 and the blocking dielectric 248 in dielectric stack 242 might be HfLaON. For example, the energy band in FIG. 2E corresponding to the tunnel dielectric (e.g., denoted by reference number 228/245) may be for either HfTaON or HfLaON, and the energy band in FIG. 2E corresponding to the blocking dielectrics (e.g., denoted by reference number 218/248) may be for either HfTaON or HfLaON. It should be noted, for example, that for either HfTaON or HfLaON, the conduction band energy level may be lower than the corresponding energy level of the interface dielectric layer 214 (e.g., OR—SiON) when tunnel dielectric 228/245 may be either HfTaON or HfLaON. This may, for example, provide faster electronic charge transport from semiconductor 202 during the writing operation (e.g., due to the internal field enhancement as mentioned earlier).

In FIG. 2E, the bottom boundary of a respective band may, for example, represent the valence energy of the material of the respective band, and the top boundary of a respective band may, for example, represent the conduction energy of the material of the respective band. For example, a respective band represents the energy difference (e.g., band-gap energy Ebg) between the conduction energy and the valence energy.

For example, interface dielectric 214 may have a conduction energy greater than the conduction energy of semiconductor 202, a valence energy larger than the valence energy of semiconductor 202, and thus a band gap greater (e.g., wider) than the band gap of semiconductor 202. Tunnel dielectric 227/244 and blocking dielectric 218/248, for example, may have a conduction energy lower than the conduction energy of interface dielectric 214, a valence energy lower than the valence energy of interface dielectric 214, and thus a band gap less than the band gap interface dielectric 214. Charge trap 228/245, for example, may have a conduction energy level lower than the conduction energy lower than that of tunnel dielectric 227/244 and blocking dielectric 218/248, a valence energy level lower than the valence energy level of tunnel dielectric 227/244 and blocking dielectric 218/248, and thus a band gap lower than the band gap of tunnel dielectric 227/244 and blocking dielectric 218/248.

In an example, the Ebg of interface dielectric 214 (e.g., OR—SiON) may be about 7.3 electron volts; the Ebg of tunnel dielectric 227 (e.g., HfTaON) may be about 4.5 electron volts; and the Ebg of charge trap 228/245 (e.g., GaN) may be about 3.4 electron volts. The trap depth of charge trap 228/245 may be about 1.6 electron volts. For example, the electronic trap depth may be defined as the average energy it takes to free an electron) from the charge trap. It may be noted, for example, that the dielectric stack design of FIG. 2E may represents a PBO stack design for a "normal mode" device design where the active electronic charge carriers (electrons and/or holes) may be supplied from semiconductor 202 while control gate 210 remains passive from charge transport perspective (e.g., no charge is being supplied by control gate 210).

Figure 2F:
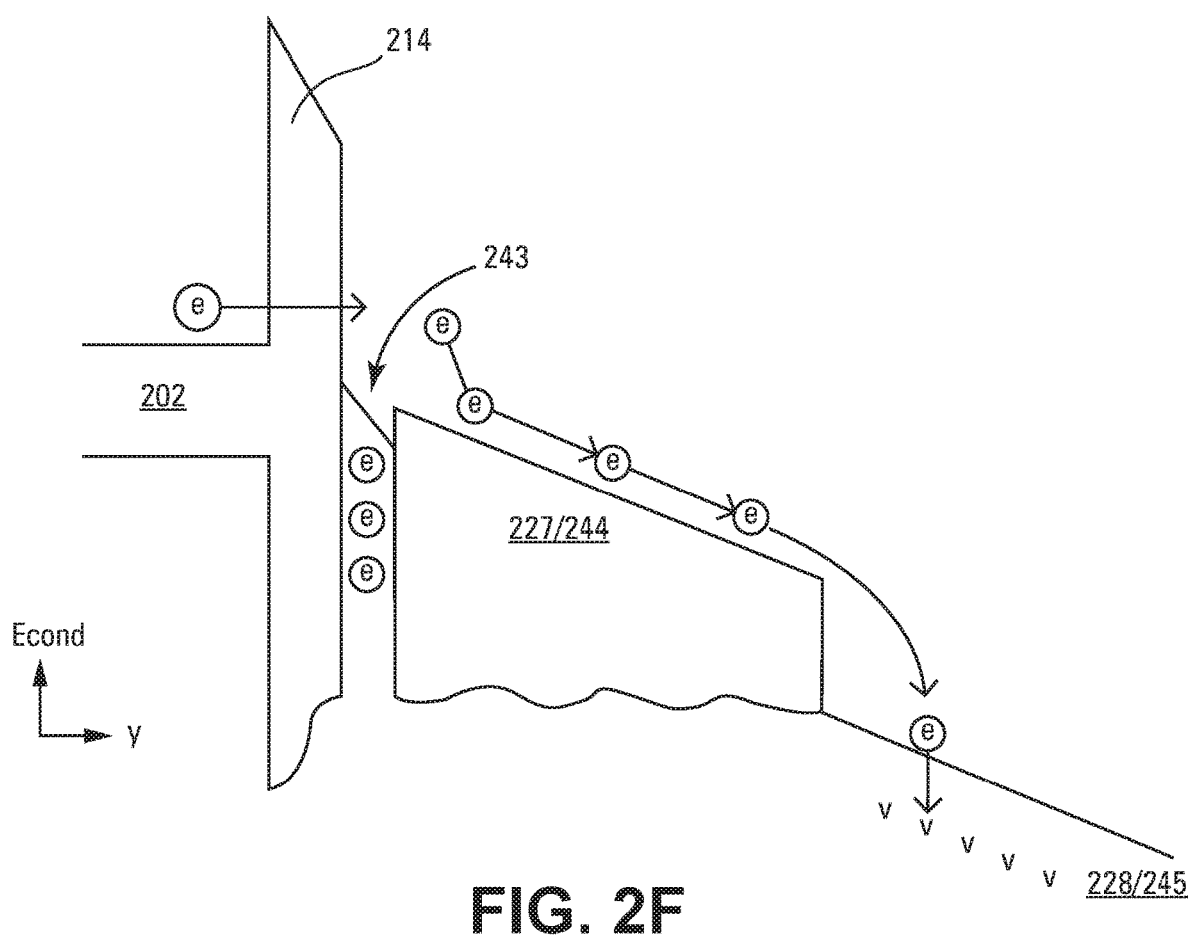
FIG. 2F is an example of a conduction band diagram for a portion of a dielectric stack during programming in accordance with a number of embodiments of the present disclosure.

FIG. 2F is an example of a conduction-energy band (Ec) diagram of a portion of a dielectric stack, such as either dielectric stack 224 or dielectric stack 242, for example, during programming (e.g., writing) in accordance with a number of embodiments of the present disclosure. For example, FIG. 2F may illustrate the conduction energies in response to an electrostatic field, resulting from a programming voltage being applied to control gate 210 (e.g., while semiconductor substrate 202 may be grounded). For example, FIG. 2F may be in response to a programming-voltage differential across a memory cell (e.g., the difference between the programming voltage applied to control gate 210 and a voltage applied to the semiconductor 202) and may show the conduction energy Econd as a function of the distance in the y-direction from semiconductor 202, for example. In some examples, the band configurations depicted in FIGS. 2E and 2F may be referred to as PBO configurations.

The example of FIG. 2F illustrates (e.g., qualitatively) charge (e.g., electron) transport from semiconductor 202 to charge trap 228/245 in response to the programming-voltage differential across a memory cell (e.g., either memory cell 222 or 240). Note, for example, that the charge transport depicted in FIG. 2F may also apply in principle (e.g., qualitatively) to memory cells 222, 240 and 250, and thus respectively to the dielectric stacks 224, 242, and 252 respectively in the examples of FIGS. 2B, 2C and 2D (e.g., as respectively illustrated in Tables 1, 2, and 3).

FIG. 2F represents the conduction band energy level versus the physical distance, in the y-direction, through different dielectrics, starting from semiconductor 202 and depicts bending of the conduction bands. The slope of the bending may, for example, qualitatively represent the internal field an electronic charge experiences as it travels through a specific dielectric. Note, for example, that conduction energy of the tunnel dielectric 227/244 may decrease with increasing y-distance away from storage dielectric 243 during programming.

When a positive potential is applied during programming, electrons may be injected from semiconductor 202 by acquiring potential energy from the applied field and may pass through the interface dielectric 214 by direct quantum mechanical tunneling. As electrons travel, for example, they may absorb additional energy due to the (e.g., steep) bending of the conduction band for interface dielectric 214, transforming the acquired potential energy into kinetic energy, and, for example, accelerating the electrons so they might move at a greater speed.

Electron transport continues, for example, through tunnel dielectric 227/244 with a different (less steep slope) rate until the electrons get trapped in charge trap 228/245 and storage dielectric 246. A portion of electrons may get trapped during transit in storage dielectric 243. This, for example, may act to enhance the refresh duration.

In examples, such as the examples of FIGS. 2C and 2D, where the storage dielectric 243 may be between interface dielectric 214 and tunnel dielectric 244, some (e.g., at least a portion of the) charges from interface dielectric 214 may be stored (e.g., in the nano-crystal storage centers of storage dielectric 243. For example, the charges may be held temporarily in the storage centers provided by storage dielectric 243. This may act, for example, to hold up some of the charge that passes through interface dielectric 214 as explained above. For example, storage dielectric 243 may act as potential well that may attract a certain portion of the electronic charges.

After the programming voltage (Vpp) is removed from control gate 210 (e.g., after programming is completed), some of the electronic charges may remain in storage dielectric 243 and may act to produce a negative electrostatic field (e.g., a negative potential). At the same time, after programming (writing), a significantly larger amount of negative charges may be stored in charge trap 228/245 and in storage dielectric 246, for example.

The combined stored negative charges in charge trap 228/245 and storage dielectric 246 may act produce a negative potential and, consequently, a negative field, for example, between the semiconductor 202 and charge trap 228/245 and storage dielectric 246 as well as between control gate 210 and charge trap 228/245 and storage dielectric 246. This, for example, may result in charge loss to both semiconductor 202 and the control gate 210, when held at ground potential after the programming operation. However, charge loss toward control gate 210 from charge trap 228/245 and storage dielectric 246 may be reduced, for example, by a longer distance for tunneling to control gate 210 from charge trap 228/245 and storage dielectric 246 and a lower field associated with the thickness and relatively low conductivity of blocking dielectric 218/248. Charge loss may be more pronounced, for example, toward semiconductor 202 from charge trap 228/245 and storage dielectric 246 (e.g., due to the possibility of direct reverse-tunneling and a higher field between semiconductor 202 and charge trap 228/245 and storage dielectric 246). The presence of electron-charged storage dielectric 243, for example, may counter and may reduce the reverse tunneling field (e.g., thereby reducing the loss toward semiconductor 202). Thus, the presence of charge centers in storage dielectric 243 may act to extend the time required for refreshing the memory write state.

Note that for the L1/L2-level memory cells associated with the examples of FIG. 2B and Table 1, programming speed may be more important than the amount of charge storage (e.g., the target values of memory window, the retention, and the refresh time). Therefore, storage dielectric 243 might be omitted for the L1/L2-level memory cells to increase the programming speed at the expense of the memory window, the retention, and the refresh time.

In some examples, a first portion of the injected charges that may directly tunnel through interface dielectric 214 may be received and (e.g., partly) held in storage dielectric 243. Another portion of the charges may be accelerated through tunnel dielectric 227/244 to charge trap 228/245. A portion of the accelerated charges may be received at charge trapping centers of charge trap 228/245 and may remain as trapped charges while another portion received at charge trap 228/245 may pass through charge trap 228/245 and into storage dielectric 246.

A portion of the portion of the charges that may be temporarily held in storage dielectric 243 may also get injected into the tunnel dielectric layer 227/244 and may be accelerated (e.g., during direct tunneling) through tunnel dielectric layer 227/244 into the charge trapping centers of charge trap 228/245. A remaining portion of the portion of the charges held in storage dielectric 243 may, for example, be stored in storage dielectric 243.

During an erase, for example, an erase potential of reverse polarity may be applied to control gate 210 of the memory cell while semiconductor 202 remains at the ground potential. For example, during an erase, charges may flow, in response to the erase potential, by direct tunneling from charge trap 228/245 through storage dielectric 227/244 and may then tunnel (e.g., directly) through interface dielectric 214 to semiconductor 202.

In some examples, charges may start to flow from storage dielectric 246 before starting to flow from charge trap 228/244. For example, the charges in storage dielectric 246 may be at (e.g., or close to) the conduction energy level of charge trapping layer 228/244, as shown in FIG. 2E, and may tunnel through the tunnel dielectric 227/244 as well as tunnel through interface dielectric 214 to semiconductor 202.

However, the charges in charge trap 228/244 may need to be de-trapped before they can flow through the conduction band of layer 228/244. For example, the charges in charge trap 228/244 need to overcome an energy barrier to be brought to the conduction energy of charge trap 228/244. Once the charges from charge trap 228/244 reach the conduction energy of charge trap 228/244, they may flow through charge trap 228/244 and tunnel through dielectric 227/244 and thereafter, tunnel through interface dielectric 214 to semiconductor 202. For example, less energy may be required to cause the charges to flow from storage dielectric 246 than from charge trap 228/244, and the erasure speed may be greater for storage dielectric 246 than for charge trap 228/244.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A memory cell, comprising:
an interface dielectric on a semiconductor;
a first storage dielectric on the interface dielectric;
a tunnel dielectric on the first storage dielectric such that the interface dielectric is between the semiconductor and the tunnel dielectric and in contact with the first storage dielectric;
a charge trap on the tunnel dielectric, such that the tunnel dielectric is beneath the charge trap and between and in direct contact with the first storage dielectric and the charge trap;
a second storage dielectric on the charge trap;
a blocking dielectric on the second storage dielectric; and
a control gate on the blocking dielectric.

2. The memory cell of claim 1, further comprising an interface metallic between the blocking dielectric the control gate.

3. The memory cell of claim 1, wherein the first storage dielectric and the second storage dielectric are of the same material.

4. The memory cell of claim 1, wherein the first storage dielectric comprises nano-particles.

5. The memory cell of claim 1, wherein the first storage dielectric is to store at least a portion of charges from the interface dielectric.

6. The memory cell of claim 1, wherein the tunnel dielectric is to accelerate charges from the interface dielectric and/or from the first storage dielectric to the charge trap.

7. The memory cell of claim 1, wherein the interface dielectric comprises silicon oxynitride, the first storage dielectric comprises injector-silicon-rich nitride, the tunnel dielectric comprises hafnium lanthanum oxynitride, the charge trap comprises gallium nitride, second storage dielectric comprises injector-silicon-rich nitride, and the blocking dielectric comprises hafnium lanthanum oxynitride or hafnium lanthanum oxynitride and aluminum oxide.

8. The memory cell of claim 1, wherein a greater energy is needed to free charge from the charge trap than from the second storage dielectric.

9. The memory cell of claim 1, wherein a conduction energy of the tunnel dielectric is to decrease with increasing distance away from the first storage dielectric during programming.

10. A method of forming a memory cell, comprising:
forming an interface dielectric on a semiconductor;
forming a first storage dielectric on the interface dielectric;
forming a tunnel dielectric on the first storage dielectric such that the interface dielectric is between the semiconductor and the tunnel dielectric and in contact with the first storage dielectric;
forming a charge trap on the tunnel dielectric such that the tunnel dielectric is beneath the charge trap and between and in direct contact with the first storage dielectric and the charge trap;
forming a second storage dielectric on the charge trap;
forming a blocking dielectric on the second storage dielectric; and
forming a control gate on the blocking dielectric.

11. The method of claim 10, further comprising forming an interface metallic between the blocking dielectric the control gate.

12. The method of claim 10, wherein forming the first storage dielectric and the second storage dielectric comprises forming the first storage dielectric and the second storage dielectric from the same material.

13. The method of claim 10, wherein forming second storage dielectric adjacent to the charge trap comprises forming the second storage dielectric such that the charge trap is between second storage dielectric and the tunnel dielectric.

14. A memory cell, comprising:
a dielectric stack on a semiconductor; and
a control gate on the dielectric stack such that the dielectric stack is between the control gate and the semiconductor;
wherein the dielectric stack comprises:
an interface dielectric on the semiconductor;
a first storage dielectric on the interface dielectric;
a tunnel dielectric on the first storage dielectric such that the interface dielectric is between the semiconductor and the tunnel dielectric and in contact with the first storage dielectric;
a charge trap on the tunnel dielectric such that the tunnel dielectric is beneath the charge trap and between and in direct contact with the first storage dielectric and the charge trap; and
a second storage dielectric on the charge trap such that the charge trap is between second storage dielectric and the tunnel dielectric.

15. The memory cell of claim 14, wherein the tunnel dielectric is in direct physical contact with the first storage dielectric and the charge trap.

16. The memory cell of claim 14, wherein the first and second storage dielectrics each comprise an injector dielectric.

17. The memory cell of claim 16, wherein the dielectric stack comprises an silicon oxynitride interface dielectric between and in direct physical contact with the first storage dielectric and the semiconductor.

18. The memory cell of claim 14, wherein the tunnel dielectric comprises hafnium lanthanum oxynitride.

19. The memory cell of claim 14, further comprising an interface metallic between the dielectric stack and the control gate.

20. The memory cell of claim 14, wherein
   the dielectric stack further comprises a hafnium lanthanum oxynitride blocking dielectric in direct physical contact with the second storage dielectric; and
   the memory cell further comprises a tantalum nitride interface metallic between and in direct physical contact with the hafnium lanthanum oxynitride blocking dielectric and the control gate.

\* \* \* \* \*